United States Patent [19]

van Uden

[11] Patent Number: 4,509,021
[45] Date of Patent: Apr. 2, 1985

[54] CIRCUIT FOR AMPLIFYING AND/OR ATTENUATING A SIGNAL

[75] Inventor: Albertus J. P. M. van Uden, Eindhoven, Netherlands

[73] Assignee: U.S. Philips Corporation, New York, N.Y.

[21] Appl. No.: 477,032

[22] Filed: Mar. 21, 1983

[30] Foreign Application Priority Data

Apr. 1, 1982 [NL] Netherlands ............ 8201376

[51] Int. Cl.³ .................................... H03G 3/12
[52] U.S. Cl. ................................ 330/282; 330/284
[58] Field of Search ............. 330/282, 278, 284, 86, 330/107, 294, 304; 179/1 P

[56] References Cited

FOREIGN PATENT DOCUMENTS 114159  9/1979  Japan ............................ 330/282

OTHER PUBLICATIONS

Gazin, J. F., "The Mos Transistor-an analogue switching device", Electronics Components, Sep. 10, 1974, vol. 16, No. 15.

Primary Examiner—James B. Mullins
Assistant Examiner—G. Wan
Attorney, Agent, or Firm—Thomas A. Briody; William J. Streeter; Edward W. Goodman

[57] ABSTRACT

In a circuit for amplifying and/or attenuating a signal, which circuit comprises an amplifier stage (3) having an inverting input and a non-inverting input and an output, a first voltage divider (5) having n taps (6.1, 6.2, ..., 6.n) is arranged between an input terminal (1) and ultimately a point of constant potential (18). The taps (6.1, 6.2, ..., 6.n) are connected to a first controllable switching unit (7) for switching individual ones of the taps (6.1 to 6.n) to the non-inverting input of the amplifier stage (3). Further, a second voltage divider (11) having m taps (12.1, 12.2, ..., 12.m) is connected between an output terminal (2), which is the output of the amplifier stage (3), and (ultimately) the point of constant potential (18). The taps (12.1 to 12.m) are connected to a second controllable switching unit (13) for switching individual ones of the taps (12.1 to 12.m) to the inverting input of the amplifier stage (3).

5 Claims, 11 Drawing Figures

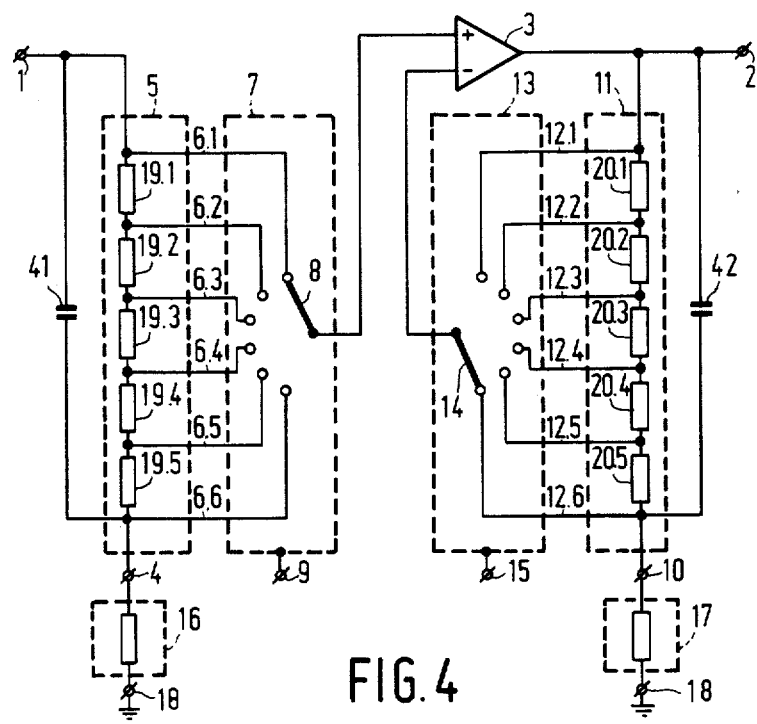
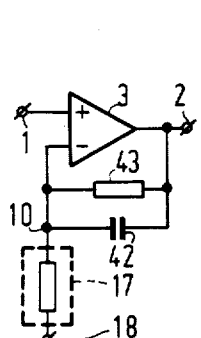
FIG.5A
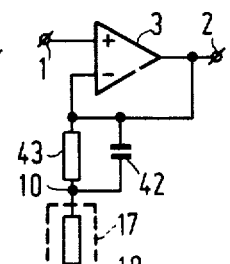
FIG.5B
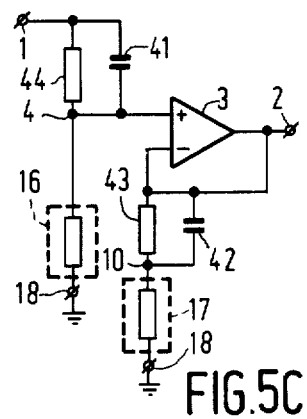
FIG.5C
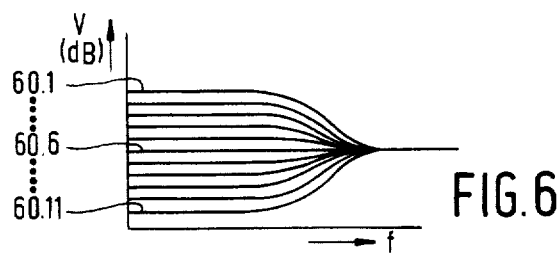
FIG.6

CIRCUIT FOR AMPLIFYING AND/OR ATTENUATING A SIGNAL

BACKGROUND OF THE INVENTION

The invention relates to a circuit for amplifying and/or attenuating a signal, which circuit has an input terminal for receiving an input signal and an output terminal for supplying an output signal, which circuit also comprises an amplifier stage having an inverting input and a non-inverting input, an output, and a controllable negative-feedback loop from the output to the inverting input. Such a circuit is known from U.S. Pat. No. 3,908,172.

The known circuit comprises two differential amplifiers.

The negative feedback of the amplifier stage and consequently the transmission of the circuit is changed in that the current distributions in the two differential amplifiers are changed in opposite senses by varying a direct voltage. The known circuit operates as a treble or bass control. However, the invention is not limited to circuits operating as treble or bass control circuits but also applies to circuits operating as frequency-independent volume control circuits. The known circuit has a number of disadvantages. If the quiescent current in the differential amplifiers is low, the circuit exhibits a high noise level. If the quiescent current is increased, the noise contribution is reduced but then the circuit exhibits substantial distortion.

SUMMARY OF THE INVENTION

It is the object of the invention to provide a circuit which has both a low noise level and a low distortion level and which moreover can readily be integrated. According to the invention the circuit is characterized in that it includes a first voltage divider having n taps ($n \geq 2$), which divider is arranged between the input terminal and a first connection terminal of the circuit and whose taps are connected to a first controllable switching unit for coupling individual ones of these taps to the non-inverting input of the amplifier stage, and a second voltage divider having m taps ($m \geq 2$), which second voltage divider is arranged between the output terminal and a second connection terminal of the circuit and whose taps are connected to a second controllable switching unit for coupling individual ones of these taps to the inverting input of the amplifier stage, the output of the amplifier stage being coupled to the output terminal, and the first and the second connection terminals being connected to a point of constant potential, optionally via an impedance each. If the position of the first switching unit is changed so that another tap of the first voltage divider (for example, a tap which is situated nearer the input terminal) is connected to the non-inverting input of the amplifier stage the gain factor of the circuit is varied (in the present example: increased). Alternatively, the position of the second switching unit may be changed so that another tap of the second voltage divider (for example, a tap which is situated nearer the output terminal) is connected to the inverting input of the amplifier stage. The negative feedback is then varied (increased), which means that the gain factor of the circuit is varied (reduced). At least one voltage divider, but suitably both voltage dividers may comprise a series arrangement of a plurality of resistors, the ends of the series arrangement and the junction points of the resistors each constituting a tap. If the first and the second connection terminals are then each connected to the point of constant potential directly or via a resistor, the circuit will operate as a frequency-independent volume control. However, if the circuit has a frequency-dependent transmission factor from the input terminal of the circuit to the non-inverting input of the amplifier stage and/or from the output to the inverting input of the amplifier stage, the circuit will operate as a frequency-dependent volume control, i.e. as a controllable filter.

An embodiment of the invention, which embodiment operates as a frequency-dependent volume control, is characterized in that the ends of the series arrangement corresponding to the first voltage divider are coupled to the input terminal of the circuit and to the first connection terminal respectively and the ends of the series arrangement corresponding to the second voltage divider are coupled to the output of the amplifier stage and to the second connection terminal respectively, and said impedances each comprise at least a capacitance arranged between the first connection terminal and the second connection terminal, respectively, and the point of constant potential. In this way a treble control circuit is obtained. Preferably, the first connection terminal is connected to the second connection terminal via a series arrangement of two resistors, and said capacitance is connected between the junction point of the two resistors and the point of constant potential. This permits one capacitance to be dispensed with, which is favourable in the case of integration.

A further embodiment of the invention, which embodiment operates as a frequency-dependent volume control circuit, is characterized in that the ends of the series arrangement corresponding to the first voltage divider are coupled to the input terminal of the circuit and to the first connection terminal respectively and the ends of the series arrangement corrseponding to the second voltage divider are coupled to the output of the amplifier stage and to the second connection terminal respectively, and first and second capacitances are connected between the input terminal of the circuit and one of the taps of the first voltage divider and between the output of the amplifier stage and one of the taps of the second voltage divider respectively. In this way a bass-control circuit is obtained.

In a preferred embodiment of the invention, the first and second switching units are incorporated in a combined switching unit, which combined switching unit comprises $n+m-1$ differential amplifiers, which differential amplifiers each have a first input and a second input for receiving a difference signal, a first output and a second output for supplying two output signals which are in phase opposition and which are dependent on the difference signal, and a control input for receiving a control signal, the first inputs of n of the differential amplifiers being each coupled to an associated tap of the first voltage divider, and the first inputs of the remaining $m-1$ differential amplifiers being all coupled to that tap of the first voltage divider which is situated nearest the input terminal of the circuit, the second inputs of said n differential amplifiers being all coupled to that tap of the second voltage divider which is situated nearest the output terminal of the circuit, and the second inputs of the remaining $m-1$ differential amplifiers being each coupled to an associated one of the remaining taps of the second voltage divider, the first outputs and the second outputs of the differential amplifiers being coupled to the inverting input and the non-inverting input of the amplifier stage, respectively, and the combined switching unit comprises means for selectively energizing individual ones of the differential amplifiers, which means are coupled to the control inputs of all the differential amplifiers. If in this embodiment n is equal to m and the two voltage dividers are made identical, a fully symmetrical control can be obtained.

DESCRIPTION OF THE DRAWINGS

Embodiments of the invention will now be described in more detail, by way of example, with reference to the Figures. In the Figures:

FIG. 4 shows a second embodiment of the invention;

FIG. 5a to FIG. 5c show the circuit of FIG. 4 in more detail for three positions of the switching units;

FIG. 6 shows the frequency response of the circuit shown in FIG. 4 for a number of positions of the switching units.

DESCRIPTION OF THE PREFERRED EMBODIMENTS

Figure 1:
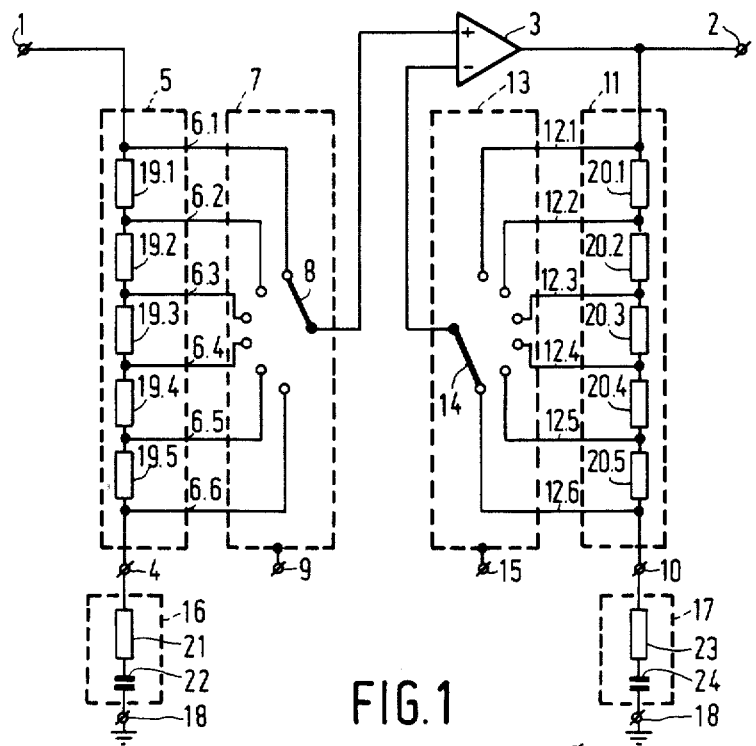
FIG. 1 shows a first embodiment of the invention.

FIG. 1 shows a first circuit for amplifying and/or attenuating a signal, which circuit has an input terminal 1 for receiving an input signal and an output terminal 2 for supplying an output signal. The circuit comprises an amplifier stage 3 having an inverting input and a non-inverting input and an output. A first voltage divider 5 is arranged between the input terminal 1 and a first connection terminal 4. The first voltage divider 5 comprises (n=) six taps 6.1 to 6.6. The six taps are connected to a first controllable switching unit 7 for connecting individual ones of the taps 6.1 to 6.6 to the non-inverting input of the amplifer stage 3. The connection of a tap to the non-inverting input by the switching unit 7 is schematically represented by a switch 8. The switch 8 can be controlled by a control signal applied to a control input 9. A second voltage divider 11 is arranged between the output terminal 2 and a second connection terminal 10. The second voltage divider 11 comprises (m=) six taps 12.1 to 12.6 which are connected to a second controllable switching unit 13 for connecting individual ones of the taps 12.1 to 12.6 to the inverting input of the amplifier stage 3. The switching function in the switching unit 13 is schematically represented by a switch 14 which can be controlled by means of a control signal applied to a control input 15. The first and second connected terminals, 4 and 10, respectively, are coupled to a point of constant potential 18 (for example ground), optionally via impedances 16 and 17, respectively. Depending on the type of components in the voltage dividers 5 and 11 and the impedances 16 and 17 (if present), it is possible to obtain a specific transmission characteristic from the input terminal 1 to the output terminal 2. FIG. 1 shows the voltage dividers 5 and 11 as comprising series arrangements of a number of resistors, 19.1 to 19.5 and 20.1 to 20.5, arranged between input terminal 1 and the first connection terminal 4 and between the output terminal 2 and the second connection terminal 10, respectively, the ends of the series arrangements and the junction points of the resistors each constituting a tap. If the connection terminals 4 and 10, respectively, are connected to the point of constant potential 18 directly or via a resistor, the circuit operates as a frequency-independent volume control circuit. However, in FIG. 1 the impedances 16 and 17 comprise a series arrangement of a resistor 21 and a capacitance 22 and a series arrangement of resistor 23 and a capacitance 24, respectively. The circuit then operates as a treble control circuit. This will be explained hereinafter by means of FIGS. 2a to 2c and FIG. 3.

Figure 2A:
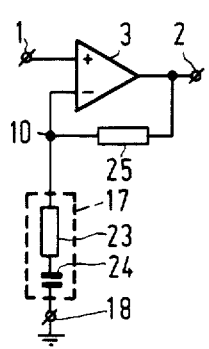
FIG. 2a to FIG. 2c show the circuit of FIG. 1 in more detail for three positions of the switching units.
Figure 3:
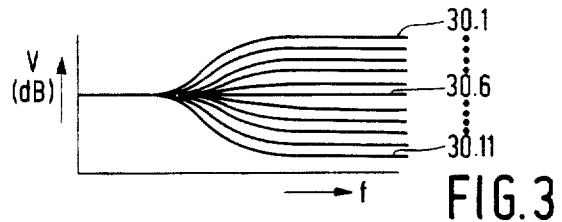
FIG. 3 shows the frequency response of the circuit shown in FIG. 1 for a number of positions of the switching units.

The circuit shown in FIG. 1 with the switches 8 and 14 in the positions shown, that is connected to the taps 6.1 and 12.6, respectively, is again shown in FIG. 2a. The feedback resistor 25 has a value corresponding to the overall resistance of the series arrangement in the voltage divider 11. For direct voltage and for very low frequencies, the capacitor 24 has an impedance which is high in comparison with resistance 25. The circuit shown in FIG. 2a, which generally has a gain factor equal to $1+R_{25}/Z_{17}$ (assuming that the gain factor of the amplifier stage 3 is very high and $Z_{17}$ and $R_{25}$ are the impedance values of the impedance 17 and the resistance 25 respectively), then has a gain factor equal to unity or 0 dB, because $Z_{17}$ approximates to infinity for frequencies towards zero. For increasing frequencies the impedance $Z_{17}$ decreases. The gain factor then increases. For very high frequencies the capacitance 24 constitutes a short-circuit. The gain factor then becomes $1+R_{25}/R_{23}$, $R_{23}$ being the resistance of 23. In FIG. 3 the curve 30.1 represents the gain factor of the circuit shown in FIG. 2a as a function of the frequency.

Figure 2B:
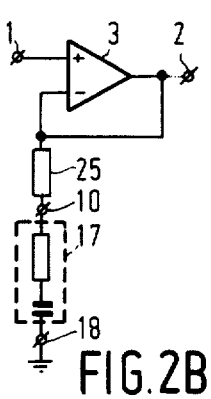

If the switch 14 is now consecutively connected to the taps 12.5, 12.4, 12.3 and 12.2 the negative-feedback resistance between the output and the inverting input of the amplifier stage 3 decreases, while the impedance between the inverting input of the amplifier stage and the point of constant potential increases (when the frequency remains constant). The gain factor of the circuit is consequently reduced. This corresponds to the curves 30.2 to 30.5 in FIG. 3. When the switch 14 is connected to the tap 12.1, the circuit shown in FIG. 2b is obtained. Then direct negative feedback is applied from the output to the inverting input of the amplifier stage 3. A series arrangement of a resistor 25 (which is the series arrangement of the voltage divider) and the impedance 17 is then situated between the inverting input and the point of constant potential 18. The gain factor of the circuit arrangement is then unity for all frequencies: see the curve 30.6 in FIG. 3.

Figure 2C:
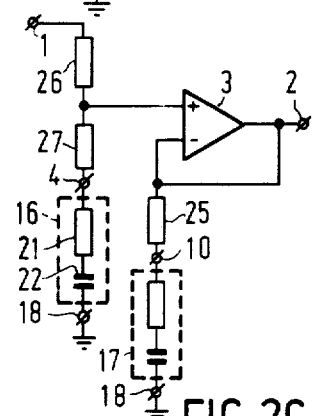

If the switch 8 is now consecutively connected to the taps 6.2, 6.3, ... , 6.6, the circuit shown in FIG. 2c is obtained, where 26 is the resistance $R_{26}$ between the input terminal 1 and the non-inverting input of the amplifier stage and 27 is the resistance $R_{27}$ between the non-inverting input and the connection terminal 4. $R_{26}+R_{27}$ corresponds to the resistance value of the series arrangement of the voltage divider 5. The gain factor of the circuit shown in FIG. 2c is equal to $(R_{27}+Z_{16})/(R_{26}+R_{27}+Z_{16})$, where $Z_{16}$ is the impedance value of the impedance 16. During switching, the resistance $R_{26}$ increases and the resistance $R_{27}$ decreases until in the position in which switch 8 is connected to the tap 6.6, the resistance $R_{27}$ has become zero and $R_{26}$ corresponds to the total resistance value in the voltage divider 5. The gain factor of the circuit then varies in accordance with the curves 30.7, 30.8, ..., 30.11 in FIG. 3, the curve 30.11 corresponding to the position in which the switch 8 is connected to the tap 6.6. The gain factor is then $Z_{16}/R_{26}+Z_{16}$. For direct voltages and very low frequencies $Z_{16}$ is very high in comparison with $R_{26}$: the gain factor is equal to 1 (0 dB). For increasing frequencies $Z_{16}$ decreases and for high frequencies it is equal to $R_{21}$, which is the resistance value of the resistor 21. The gain factor is then $R_{21}/R_{26}+R_{21}$.

If the resistance value of 19.1 is selected to be equal to that of 20.1, if the next resistors 19.2 to 19.5 have the same values as 20.2 to 20.5, and if the resistor 21 and the capacitor 22 are selected to be identical to the resistor 23 and the capacitor 24, a treble control is obtained which is fully symmetrical around 0 dB. In general however the resistors 19.1 to 19.5 and 21 and the capacitor 22 may all be selected so that they are not identical to the corresponding resistors 20.1 to 20.5 and 23 and the capacitor 24. If the resistances 21 and 23 are equal and the capacitances 22 and 24 are equal, only one impedance is required which is then connected between the new interconnected connection terminals 4 and 10 and the point of constant potential 18, which is favorable for integration in an integrated circuit, because space is saved by dispensing with one capacitance and one resistance. Furthermore, it is not necessary to adhere to the circuit arrangement described in the foregoing in which the switch 14 first passes from tap 12.6 to tap 12.1 and subsequently switch 8 from tap 6.1 to tap 6.6. In principle, all combinations of a tap of voltage divider 5 connected to the non-inverting input and a tap of voltage divider 11 connected to the inverting input of the amplifier stage 3 are possible. In this last-mentioned case, the connection terminals 4 and 10 should not be interconnected when the impedances 16 and 17 are equal, because switch 8 connected to tap 6.6 and switch 14 to tap 12.6 will not yield a correctly operating circuit. In this situation, the two resistors 21 and 23 must be maintained. However, it is still possible to use only one capacitance arranged between the junction point of the two resistors 21 and 23, which are then connected in series between the connection terminals 4 and 10, and the point of constant potential.

If in the circuit shown in FIG. 1 the capacitances in the impedances 16 and 17 are replaced by inductances, a bass control circuit is obtained.

FIG. 4 shows a circuit which operates as a bass control circuit. Parts in FIGS. 1 and 4 bearing the same reference numerals are identical. The first and second connection terminals, 4 and 10, respectively, are connected to the point of constant potential 18 via impedances 16 and 17, respectively, each in the form of a resistor. A first capacitance 41 is connected between the input terminal 1 of the circuit and one of the taps (in the present case the tap 6.6) of the first voltage divider 5, and a second capacitance 42 is connected between the output terminal 2 and one of the taps (in the present case 12.6) of the second voltage divider 11. If the two capacitances 41 and 42 are connected to taps other than 6.6 and 12.6, respectively, the impedance between the connection terminal 4 or 10 and the point of constant potential may be dispensed with. The operation of the circuit shown in FIG. 4 will be explained with reference to FIGS. 5a, 5b, 5c and 6. The circuit shown in FIG. 4 with the switches 8 and 14 in the positions indicated, that is connected to the taps 6.1 and 12.6, respectively, is again shown in FIG. 5a. Negative feedback is provided by the parallel arrangement of the resistor 43 and the capacitance 42. The resistor 43 corresponds to the overall resistance of the series arrangement of the voltage divider 11. For direct voltage and for very low frequencies, the capacitance 42 has an impedance which is high in comparison with the resistance value $R_{43}$ of 43. The circuit then has a gain factor $1+R_{43}/R_{17}$ ($R_{17}$ is the resistance value of the resistor 17 and the gain of the amplifier stage is very high). For increasing frequencies the impedance in the negative-feedback loop decreases. For very high frequencies the capacitance 42 constitutes a short-circuit. The gain is then unity (0 dB).

In FIG. 6 the curve 60.1 represents the gain factor of the circuit shown in FIG. 5a as a function of the frequency. When the switch 14 is connected to the tap 12.1 the circuit shown in FIG. 5b is obtained. Now there is direct negative feedback from the output to the inverting input of the amplifier stage 3. The parallel arrangement of the resistor 43 and the capacitance 42 is now connected in series with the resistor 17 between the inverting input and the point of constant potential 18. The gain factor of the circuit is then equal to unity for all frequencies: see the curve 60.6 in FIG. 6.

The intermediate curves 60.2, 60.3, 60.4 and 60.5 correspond to the gain factor for a circuit in which the switch 14 is connected to the respective taps 12.5, 12.4, 12.3 and 12.2. The circuit shown in FIG. 5c corresponds to the circuit shown in FIG. 4, in which the switch 14 is connected to tap 12.1 and the switch 8 is connected to the tap 6.6. This results in a frequency-dependent voltage divider at the non-inverting input of the amplifier stage 3. For direct voltage and for very low frequencies, the impedance of the capacitor 41 is very high compared with that of the resistor 44. The resistance value $R_{44}$ of the resistor 44 corresponds to the overall series resistance in the voltage divider 5. The gain factor of the circuit is then $R_{16}/R_{44}+R_{16}$, in which $R_{16}$ is the resistance value of the resistor 16. For high frequencies the capacitor 41 constitutes a short-circuit. The gain factor is then unity. The curve 60.11 represents the gain factor of the circuit shown in FIG. 5c as a function of the frequency. The intermediate curves 60.7, 60.8, 60.9 and 60.10 represent the gain factors as a function of the frequency for the circuit shown in FIG. 4 when the switch 14 is connected to the tap 12.1 and the switch 8 to the respective taps 6.2, 6.3, 6.4 and 6.5. For the values of the various resistors and the number of taps, the same is valid as stated in the description with reference to FIG. 1.

Figure 7:
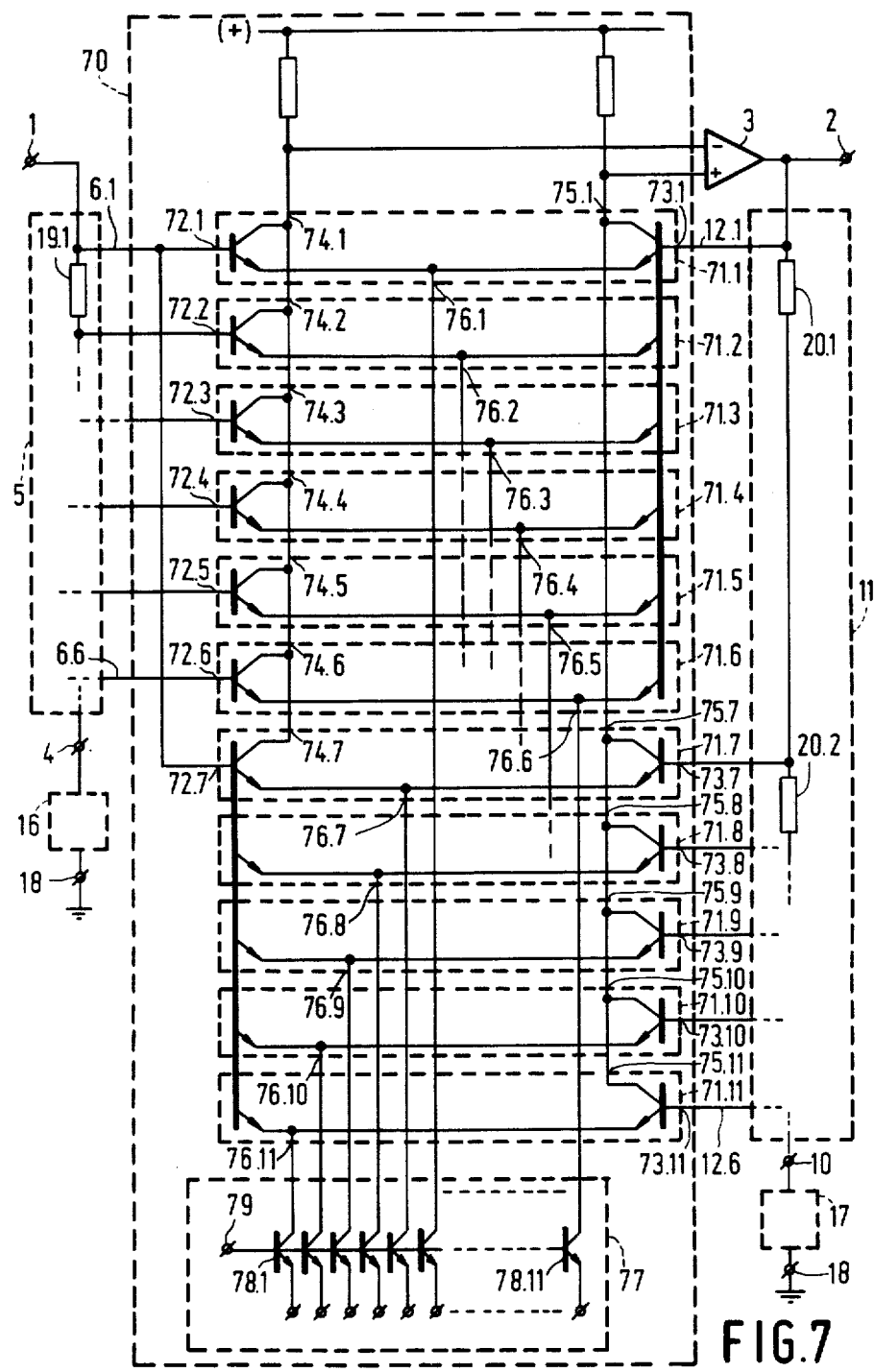
FIG. 7 shows a combined switching unit which it is possible to use in a circuit in accordance with the invention.

FIG. 7 shows a preferred embodiment of the first and second switching units 7 and 13 shown in FIGS. 1 and 4. The first and second switching units are incorporated in a combined switching unit bearing the reference numeral 70. The combined switching unit comprises a plurality of differential amplifiers, the number of differential amplifiers corresponding to the sum of the number of taps of the first and second voltage dividers, 5 and 11, respectively, minus one, that is $n+m-1$ or eleven in the case of the circuits shown in FIGS. 1 and 4. The differential amplifiers are designated 71.1 to 71.11 in FIG. 7. Each differential amplifer (such as 71.i, i varying from 1 to 11) has first and second inputs (72.i and 73.i, respectively) for receiving a difference signal, first and second outputs (74.i and 75.i, respectively) for supplying two output signals which are in phase opposition and which depend on the difference signal, and a control input (76.i) for receiving a control signal. The first inputs of six of the differential amplifiers, namely the inputs 72.1 to 72.6 of the differential amplifiers 71.1 to 71.6, are each coupled to a respective tap of the first voltage divider 5, namely taps 6.1, ..., 6.6. The first inputs of the other differential amplifier 71.7 to 71.11 are all coupled to the tap 6.1.

The second inputs of said six differential amplifiers 71.1 to 71.6 are all coupled to the tap 12.1. The second inputs of the other differential amplifiers, namely the inputs 73.7 to 73.11, are each coupled to a respective one of the remaining taps of the second voltage divider 11, namely taps 12.2 to 12.6. The first outputs 74.1, 74.2, ... etc. of all differential amplifiers 71.i are coupled to the inverting input of the amplifier stage 3 and the second outputs 75.1, 75.2, ..., etc. of all differential amplifiers 71.i are coupled to the non-inverting input of the amplifier stage 3. Further, the combined switching unit 70 comprises means 77 for selectively energizing individual ones of the differential amplifiers 71.i. These means 77 are coupled to the control inputs 76.1, 76.2, ..., etc. of all differential amplifiers 71.i. Each differential amplifier 71.i comprises two transistors, whose bases are connected to the first input and to the second input respectively, whose collectors are connected to the first output and to the second output respectively, and whose emitters are both connected to the control input of the differential amplifier. The means 77 comprise a plurality of (also $n+m-1$, or eleven) transistors 78.1 to 78.11, whose bases are all connected to a point of constant potential 79 and whose collectors are each connected to a control input of an associated differential amplifier. The emitters of all transistors but one receive a high voltage, so that they are turned off. One transistor receives a low voltage, so that it is turned on. The associated differential amplifier 71.i is then selected, that is, only the signals on the first and second inputs of this differential amplifier 71.i are transferred to the inputs of the amplifier stage 3 by the combined switching unit 70. By consecutively applying a low voltage to the emitters of the transistors 78.1, 78.2, ... to 78.11 the connection scheme as described with reference to FIGS. 1 and 4 is obtained. This means that when the switch 8 is in the upper position (i.e. coupled to the tap 6.1), it is possible to select one of the taps 12.1 to 12.6 with the switch 14 and when the switch 14 is in the upper position (i.e. coupled to the tap 12.1) it is possible to select one of the taps 6.1 to 6.6 by means of the switch 4.

If in the combined switching unit 70 an arbitrary one of the taps 6.1 to 6.6 is to be combined with an arbitrary one of the taps 12.1 to 12.6, the combined switching unit should be extended to n times m differential amplifiers.

The first inputs of the first n differential amplifiers are then each connected to a respective one of the n taps of the first voltage divider 5 and the second inputs of these first n differential amplifiers are all connected to the first tap (12.1) of the second voltage divider 11. The first inputs of the second set of n differential amplifiers are each connected to a respective one of the n taps of the first voltage divider 5 and the second inputs of this second set of n differential amplifiers are all connected to the second tap (12.2) of the second voltage divider 11. This continues up to the $m^{th}$ set of n differential amplifiers, whose first inputs are each connected to a respective one of the taps of the first voltage divider 5 and whose second inputs are all connected to the $m^{th}$ tap (12.6) of the second voltage divider 11. The means 77 should then also be extended so that it is possible to selectively drive individual ones of said n times m differential amplifiers.

It is to be noted that the invention is not limited to the circuit arrangement as shown in the Figures. The invention also applies to circuit arrangements which differ from the embodiments shown with respect to points which do not relate to the inventive idea. For example, it is possible to employ field effect transistors (such as MOS transistors) instead of bipolar transistors.

What is claimed is:

1. A circuit for amplifying and/or attenuating a signal, including an input terminal for receiving an input signal, an output terminal for supplying an output signal, and an amplifier stage, which amplifier stage includes an inverting input, a non-inverting input, an output and a controllable negative-feedback loop from the output to the inverting input thereof, the circuit further including a first voltage divider having n taps ($n \geq 2$) arranged between the input terminal and a first connection terminal, a first controllable switching unit for selectively coupling said n taps to the non-inverting input of said amplifier stage, a second voltage divider having m taps ($m \geq 2$) arranged between the output terminal and a second connection terminal, and a second controllable switching unit for selectively coupling said m taps to the inverting input of said amplifier stage, said second voltage divider and said second controllable switching unit comprising said negative-feedback loop, the output of said amplifier stage being coupled to the output terminal, and the first and second connection terminals being coupled to a point of constant potential, characterized in that said first and second voltage dividers each comprises a series arrangement of a plurality of resistors, the ends of the series arrangement and the junction points of the resistors each constituting a tap, and the end of the series arrangement corresponding to the first voltage divider are coupled to the input terminal of the circuit and to the first connection terminal, respectively, and the ends of the series arrangement corresponding to the second voltage divider are coupled to the output of the amplifier stage and to the second connection terminal, respectively, and said circuit further comprises impedances connected between said connection terminals and said point of constant potential, respectively, wherein said impedances each comprises at least a capacitance arranged between the first connection terminal and the second connection terminal, respectively, and the point of constant potential.

2. A circuit as claimed in claim 1, characterized in that the first connection terminal is connected to the second connection terminal via a series arrangement of two resistors, and said capacitance is connected between the junction point of the two resistors and the point of constant potential.

3. A circuit for amplifying and/or attenuating a signal, including an input terminal for receiving an input signal, an output terminal for supplying an output signal, and an amplifier stage, which amplifier stage includes an inverting input, a non-inverting input, an output and a controllable negative-feedback loop from the output to the inverting input thereof, the circuit further including a first voltage divider having n taps ($n \geq 2$) arranged between the input terminal and a first connection terminal, a first controllable switching unit for selectively coupling said n taps to the non-inverting input of said amplifier stage, a second voltage divider having m taps ($m \geq 2$) arranged between the output terminal and a second connection terminal, and a second controllable switching unit for selectively coupling said m taps to the inverting input of said amplifier stage, said second voltage divider and said second controllable switching unit comprising said negative-feedback loop, the output of said amplifier stage being coupled to the output terminal, and the first and second connection terminals being coupled to a point of constant potential, characterized in that said first and second voltage dividers each comprises a series arrangement of a plurality of resistors, the ends of the series arrangement and the junction points of the resistors each constituting a tap, and the ends of the series arrangement corresponding to the first voltage divider are coupled to the input terminal of the circuit and to the first connection terminal, respectively, and the ends of the series arrangement corresponding to the second voltage divider are coupled to the output of the amplifier stage and to the second connection terminal, respectively, and first and second capacitances are connected between the input terminal of the circuit and one of the taps of the first voltage divider and between the output of the amplifier stage and one of the taps of the second voltage divider, respectively.

4. A circuit for amplifying and/or attenuating a signal, including an input terminal for receiving an input signal, an output terminal for supplying an output signal, and an amplifier stage, which amplifier stage includes an inverting input, a non-inverting input, an output and a controllable negative-feedback loop from the output to the inverting input thereof, the circuit further including a first voltage divider having n taps $(n \geq 2)$ arranged between the input terminal and a first connection terminal, a first controllable switching unit for selectively coupling said n taps to the non-inverting input of said amplifier stage, a second voltage divider having m taps $(m \geq 2)$ arranged between the output terminal and a second connection terminal, and a second controllable switching unit for selectively coupling said m taps to the inverting input of said amplifier stage, said second voltage divider and said second controllable switching unit comprising said negative-feedback loop, the output of said amplifier stage being coupled to the output terminal, and the first and second connection terminals being coupled to a point of constant potential, characterized in that the first and second switching units are incorporated in a combined switching unit, which combined switching unit comprises $n+m-1$ differential amplifiers, which differential amplifiers each have a first input and a second input for receiving a difference signal, a first output and a second output for supplying two output signals which are in phase opposition and which are dependent on the difference signal, and a control input for receiving a control signal, the first inputs of n of the differential amplifiers being each coupled to an associated tap of the first voltage divider, and the first inputs of the remaining $m-1$ differential amplifiers being all coupled to that tap of the first voltage divider which is situated nearest the input terminal of the circuit, the second inputs of said n differential amplifiers being all coupled to that tap of the second voltage divider which is situated nearest the output terminal of the circuit, and the second inputs of the remaining $m-1$ differential amplifiers being each coupled to an associated one of the remaining taps of the second voltage divider, the first outputs and the second outputs of the differential amplifiers being coupled to the inverting input and the non-inverting input of the amplifier stage, respectively, and the combined switching unit comprising means for selectively energizing individual one of the differential amplifiers, which means are coupled to the control inputs of all the differential amplifiers.

5. A circuit as claimed in claim 1, 2, 3 or 4 characterized in that the circuit has a frequency-dependent transmission factor from the input terminal of the circuit to the non-inverting input of the amplifier stage and/or from the output to the inverting input of the amplifier stage.

* * * * *